United States Patent
Knaipp

(10) Patent No.: US 9,748,408 B2
(45) Date of Patent: Aug. 29, 2017

(54) HIGH-VOLTAGE SEMICONDUCTOR DEVICE AND METHOD OF PRODUCING THE SAME

(71) Applicant: ams AG, Unterpremstaetten (AT)

(72) Inventor: Martin Knaipp, Unterpremstaetten (AT)

(73) Assignee: AMS AG, Unterpremstaetten (AT)

(*) Notice: Subject to any disclaimer, the term of this patent is extended or adjusted under 35 U.S.C. 154(b) by 0 days.

(21) Appl. No.: 15/038,447

(22) PCT Filed: Nov. 4, 2014

(86) PCT No.: PCT/EP2014/073724
§ 371 (c)(1),
(2) Date: May 20, 2016

(87) PCT Pub. No.: WO2015/074866
PCT Pub. Date: May 28, 2015

(65) Prior Publication Data
US 2016/0293777 A1    Oct. 6, 2016

(30) Foreign Application Priority Data

Nov. 22, 2013 (EP) .................................. 13194098

(51) Int. Cl.
*H01L 29/66*   (2006.01)
*H01L 29/808*  (2006.01)
(Continued)

(52) U.S. Cl.
CPC ........ *H01L 29/808* (2013.01); *H01L 21/2253* (2013.01); *H01L 21/266* (2013.01);
(Continued)

(58) Field of Classification Search
CPC ............. H01L 29/808; H01L 29/66901; H01L 29/063; H01L 29/1095; H01L 29/404;
(Continued)

(56) References Cited

U.S. PATENT DOCUMENTS 6,084,254 A     7/2000 Kim
7,135,738 B2 *  11/2006 Williams .......... H01L 21/26513
                                                    257/328

(Continued)

FOREIGN PATENT DOCUMENTS

DE       102011108651 A1    1/2013

OTHER PUBLICATIONS

Liaw, Chorng-Wei et al, "Pinch-Off Voltage-Adjustable High-Voltage Junction Field-Effect Transistor", IEEE Electron Device Letters, vol. 28, No. 8, Aug. 2007, pp. 737-739.
(Continued)

*Primary Examiner* — Long K Tran
(74) *Attorney, Agent, or Firm* — McDermott Will & Emery LLP

(57) ABSTRACT

The semiconductor drift device comprises a deep well of a first type of electrical conductivity provided for a drift region in a substrate of semiconductor material, a drain region of the first type of conductivity at the surface of the substrate, a plurality of source regions of the first type of conductivity in shallow wells of the first type of conductivity at the periphery of the deep well of the first type, and a deep well or a plurality of deep wells of an opposite second type of electrical conductivity provided for a plurality of gate regions at the periphery of the deep well of the first type. The gate regions are formed by shallow wells of the second type of electrical conductivity, which are arranged in the deep well of the second type between the shallow wells of the first type.

12 Claims, 6 Drawing Sheets

(51) Int. Cl.
| | |
|---|---|
| *H01L 29/40* | (2006.01) |
| *H01L 29/06* | (2006.01) |
| *H01L 29/08* | (2006.01) |
| *H01L 29/10* | (2006.01) |
| *H01L 21/225* | (2006.01) |
| *H01L 21/266* | (2006.01) |

(52) U.S. Cl.
CPC ........ *H01L 29/063* (2013.01); *H01L 29/0692* (2013.01); *H01L 29/0843* (2013.01); *H01L 29/1066* (2013.01); *H01L 29/1095* (2013.01); *H01L 29/404* (2013.01); *H01L 29/66901* (2013.01)

(58) Field of Classification Search
CPC .............. H01L 29/0692; H01L 29/0843; H01L 29/1066; H01L 21/2253; H01L 21/266
USPC .......................................... 257/259, 379, 358
See application file for complete search history.

(56) References Cited

U.S. PATENT DOCUMENTS

| | | | |
|---|---|---|---|
| 7,663,203 B2* | 2/2010 | Knaipp | ................. H01L 21/266 257/492 |
| 2008/0117653 A1 | 5/2008 | Saito | |
| 2012/0187458 A1* | 7/2012 | Knaipp | ............... H01L 29/0692 257/256 |
| 2013/0265102 A1 | 10/2013 | Lin et al. | |

OTHER PUBLICATIONS

Karino, T. et al, "700V PIC Technology Based on 0.35 μm Design for AC-DC Power Units", Proceedings of the 2012 24th International Symposium on Power Semiconductor Devices and ICs, Jun. 3-7, 2012, pp. 209-212.

* cited by examiner

US 9,748,408 B2

HIGH-VOLTAGE SEMICONDUCTOR DEVICE AND METHOD OF PRODUCING THE SAME

BACKGROUND OF THE INVENTION

In high-voltage semiconductor drift devices, a well that is supplied with current may be protected by a resistor that is pinched-off during the occurrence of high voltages.

US 2008/0117653 A1 discloses a high-voltage JFET device that works asymmetrically with respect to the source and drain terminals. Because of the low net doping concentration, the lateral resistance is high in the vicinity of the edge of the drift well, and pinch-off voltage and on-resistance cannot both be made as low as desired.

In the paper of T. Karino et al.: "700V PIC Technology Based on 0.35 µm Design for AC-DC Power Units" in Proceedings of the 2012 24th International Symposium on Power Semiconductor Devices and ICs, pages 209 to 212, a HVJFET produced in the 700V-class power IC technology is described.

SUMMARY OF THE INVENTION

The semiconductor drift device comprises a substrate of semiconductor material, a deep well of a first type of electrical conductivity provided for a drift region in the substrate, a drain region of the first type of electrical conductivity arranged at a surface of the substrate at a center of the deep well of the first type, a plurality of source regions of the first type of electrical conductivity arranged outside the deep well of the first type in shallow wells of the first type of electrical conductivity at the periphery of the deep well of the first type, and a deep well or a plurality of deep wells of a second type of electrical conductivity opposite to the first type of electrical conductivity provided for a plurality of gate regions at the periphery of the deep well of the first type. The gate regions are formed by shallow wells of the second type of electrical conductivity, which are arranged in the deep well of the second type between the shallow wells of the first type. The first type of electrical conductivity may be n-type conductivity and the second type of electrical conductivity p-type conductivity, for example.

In an embodiment of the semiconductor drift device, one continuous deep well of the second type is provided for the gate regions, and the shallow wells of the second type are arranged in the continuous deep well of the second type.

In a further embodiment, a plurality of separate deep wells of the second type is provided for the gate regions, and each shallow well of the second type is arranged in one of the deep wells of the plurality of deep wells of the second type.

A further embodiment comprises a gate metal electrically connected to gate contact areas of the shallow wells of the second type, a source metal electrically connected to source contact areas of the source regions, and a drain metal electrically connected to a drain contact area of the drain region.

In a further embodiment, the shallow wells of the first type are arranged at the same distance from the center, and the shallow wells of the second type are arranged at the same distance from the center.

In a further embodiment, the shallow wells of the first type extend into the deep well of the first type and thus exceed a boundary between the deep well of the first type and the deep well of the second type by a positive first distance.

A further embodiment comprises an insulating region covering the substrate between the source regions and the drain region and a first field plate arranged on the insulating region, the first field plate partially overlapping the shallow wells of the first type and the shallow wells of the second type.

In a further embodiment, the first field plate partially overlaps the deep well of the first type, so that a second distance between a portion of the first field plate that overlaps the shallow wells of the first type and an opposite edge of the first field plate is positive.

In a further embodiment, at least one further field plate is arranged at a distance from the insulating region above the deep well of the first type and is electrically connected with the first field plate.

In a further embodiment, the first field plate is polysilicon and the further field plate is metal.

In a further embodiment, the lower boundary of the deep well of the first type has distances from the plane of the substrate surface that increase towards the center. Furthermore, the deep well of the first type can have a doping concentration that increases towards the center.

The method of producing the semiconductor drift device comprises implanting a deep well of a first type of electrical conductivity provided for a drift region in a substrate of semiconductor material, the deep well of the first type comprising a periphery, implanting a deep well or a plurality of deep wells of a second type of electrical conductivity opposite to the first type of electrical conductivity at the periphery of the deep well of the first type, implanting shallow wells of the first type of electrical conductivity at the periphery of the deep well of the first type, the shallow wells of the first type extending into the deep well of the first type, and implanting shallow wells of the second type of electrical conductivity adjacent to the deep well of the first type between the shallow wells of the first type of electrical conductivity.

In a variant of the method, the deep wells of the second type are produced with gaps in between, the shallow wells of the first type being formed covering the gaps.

In a further variant of the method, a first dimension of the shallow wells of the first type, which is defined by a distance between two adjacent shallow wells of the second type, is larger than a second dimension of the gaps, which is defined by a distance between two adjacent deep wells of the second type.

In a further variant of the method, an insulating region is formed at the substrate surface, the insulating region covering a boundary between the deep well of the first type and the shallow well of the first type. A first field plate is arranged on the insulating region, so that the first field plate partially overlaps the deep well of the first type, the shallow wells of the first type, and the shallow wells of the second type.

In a further variant of the method, the first field plate is formed from polysilicon, and a further field plate formed from a metal is arranged above the insulating region at a distance from the first field plate. The first field plate and the further field plate are electrically connected by a connection formed from electrically conductive material.

In a further variant of the method, for the implantation of the deep well of the first type, a mask with openings that are limited by concentric circles is used, so that a plurality of concentric annular implantation regions are formed. Widths of the mask openings may increase towards the center of the circles, so that the implantation regions are formed with widths increasing towards the center. By performing a diffusion of the implanted dopants, the deep well of the first type is formed as a continuous doped region with its doping concentration increasing towards the center.

The following is a detailed description of examples of the semiconductor drift device and the method of producing the semiconductor drift device in conjunction with the appended figures.

DETAILED DESCRIPTION

Figure 1:
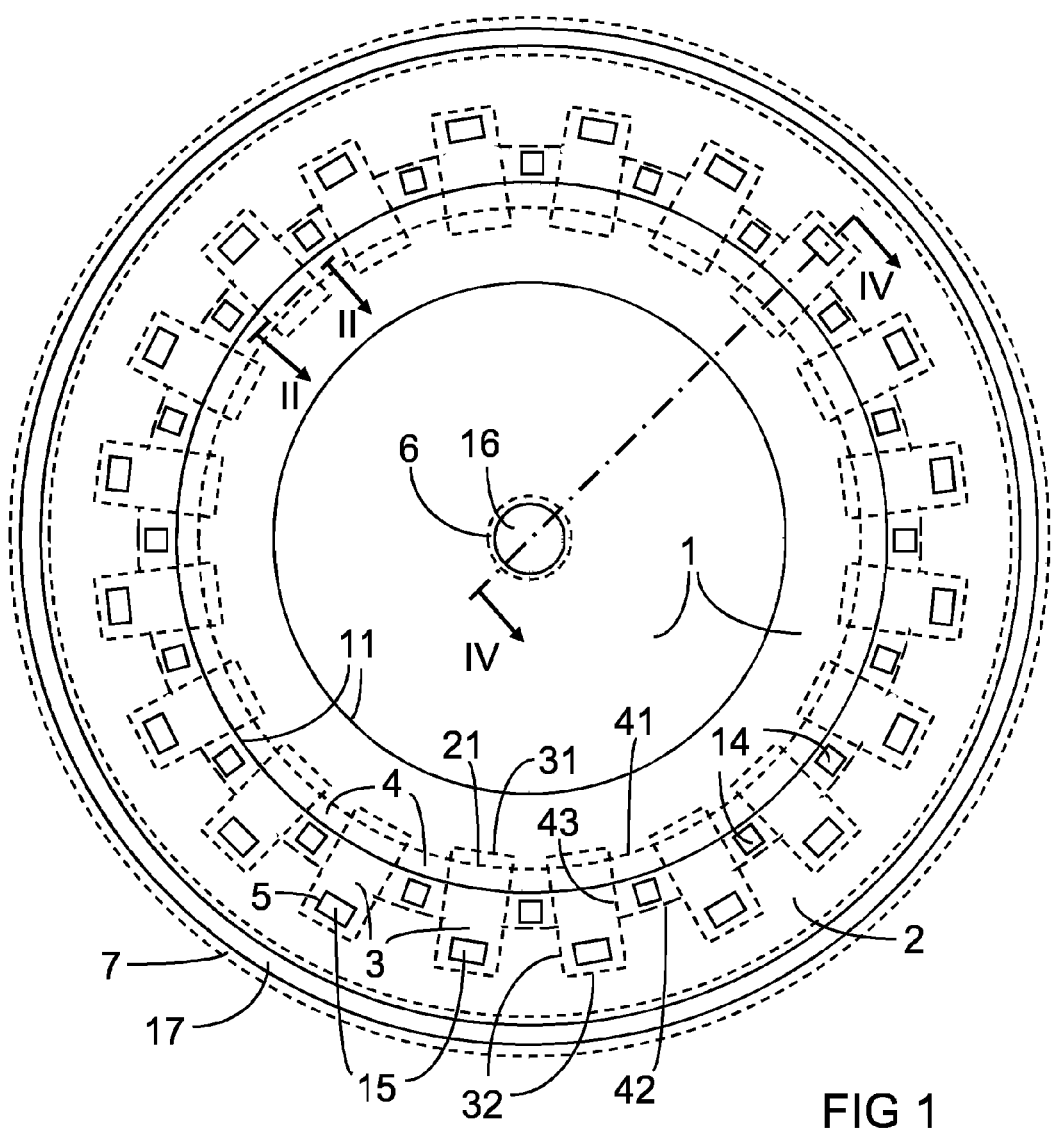
FIG. 1 is a top view of the well structure of an embodiment of the semiconductor drift device.

FIG. 1 shows a schematic top view of the well structure inside a substrate of semiconductor material in accordance with embodiments of the semiconductor drift device. Hidden contours of well boundaries below the substrate surface are represented with broken lines. The semiconductor material may be silicon, for instance. A deep well of a first type of electrical conductivity 1, which may be n-type conductivity, for instance, is arranged at the center of the well structure and is surrounded by a deep well of a second type of electrical conductivity 2, which is opposite to the first type of electrical conductivity and may be p-type conductivity. These wells are deep in comparison with further wells in the substrate, which will be designated as shallow wells in the following. The wells can be produced by dopants for the different types of electrical conductivity, which may be implanted into the substrate. The semiconductor material of the substrate may comprise a basic doping for the second type of electrical conductivity, for instance. The boundary 21 between the deep well of the first type 1 and the deep well of the second type 2 is indicated in FIG. 1 by a broken circular contour.

At the periphery of the deep well of the first type 1, shallow wells of the first type of electrical conductivity 3 and shallow wells of the second type of electrical conductivity 4 are alternatingly arranged in the deep well of the second type 2. Thus the shallow wells of the first type 3 succeeding one another around the periphery of the deep well of the first type 1 are separated by the shallow wells of the second type 4 and vice versa. The boundaries 31 between the deep well of the first type 1 and the shallow wells of the first type 3, the boundaries 32 between the deep well of the second type 2 and the shallow wells of the first type 3, the boundaries 41 between the deep well of the first type 1 and the shallow wells of the second type 4, the boundaries 42 between the deep well of the second type 2 and the shallow wells of the second type 4, and the boundaries 43 between the shallow wells of the first type 3 and the shallow wells of the second type 4 are indicated in FIG. 1 with broken lines as hidden contours. The shallow wells of the first type 3 optionally exceed the boundary 21 between the deep well of the first type 1 and the deep well of the second type 2 in the direction towards the center of the deep well of the first type 1, so that the shallow wells of the first type 3 reach into the deep well of the first type 1.

Source regions 5 of the first type of electrical conductivity are arranged in the shallow wells of the first type 3 and optionally comprise a concentration of the dopant that is higher than the concentration of the dopant in the shallow wells of the first type 3. FIG. 1 shows source contact areas 15 at the surfaces of the source regions 5. The shallow wells of the second type 4 are provided for gate regions.

A drain region 6 of the first type of electrical conductivity is arranged at a center of the deep well of the first type 1. The drain region 6 optionally comprises a concentration of the dopant for the first electrical conductivity that is higher than the concentration of the dopant in the deep well of the first type 1. FIG. 1 shows a drain contact area 16 at the surface of the drain region 6.

A substrate contact region 7, which optionally comprises the second type of electrical conductivity, may be arranged around the deep well of the second type 2. The substrate contact region 7 may comprise a doping concentration that is suitable for the formation of an ohmic contact on the substrate contact area 17 at the surface of the substrate contact region 7 indicated in FIG. 1.

FIG. 1 shows a first field plate 11 in the shape of a ring, whose edges are indicated by two concentric circles. The first field plate 11 is formed from an electrically conductive material, which may be doped polysilicon, for instance, and is optionally arranged on an insulating region, which covers an area of the substrate surface between the source contact areas 15 and the drain contact area 16. The insulating region is not shown in FIG. 1 and will be described below. The first field plate 11 partially overlaps the deep well of the first type 1 and the shallow wells of the first type 3 and may also partially overlap the shallow wells of the second type 4. The arrangement of the described elements according to FIG. 1 may be centrally symmetric.

Figure 2:
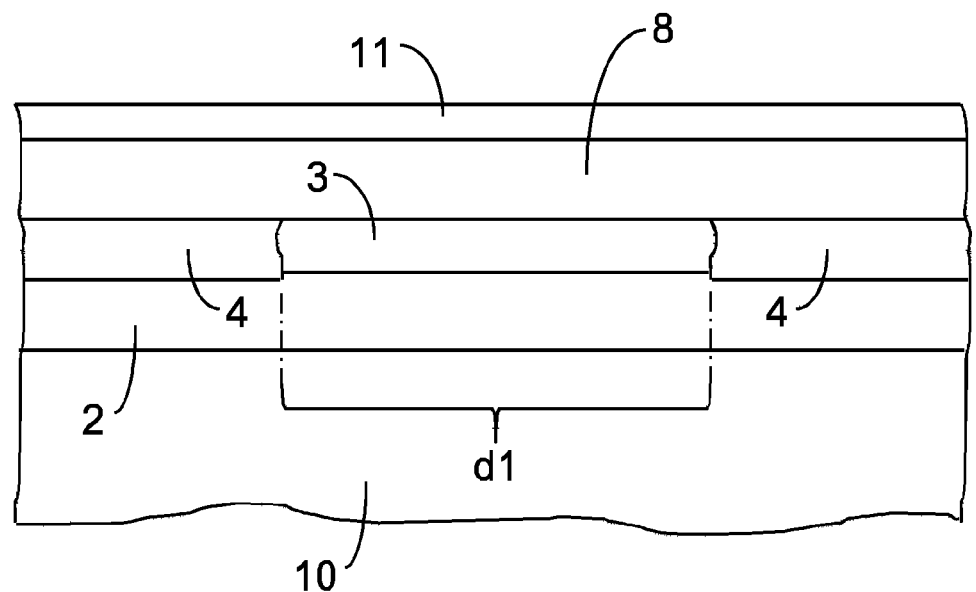
FIG. 2 is a cross section of the well structure of the embodiment according to FIG. 1.

FIG. 2 shows the well structure of the embodiments according to FIG. 1 in a cross section at a position near the boundary between the deep well of the first type 1 and the deep well of the second type 2. This position is indicated in FIG. 1 by a dash-dotted line, and the direction of view is indicated by arrows. FIG. 2 shows the substrate 10 with the deep well or wells of the second type 2 and the alternating arrangement of the shallow wells of the first type 3 and the shallow wells of the second type 4 at a position near the periphery of the deep well of the first type 1. The substrate surface is covered by an insulating region 8, on which the first field plate 11 is arranged. The insulating region 8 may be formed by a shallow trench isolation, by a structured field oxide, or by a LOCOS (local oxidation of silicon) region, for instance.

In the embodiment according to FIG. 2, the deep well of the second type 2 extends continuously under the shallow wells of the first type 3, each of which occupies the region between the two adjacent shallow wells of the second type 4. The distance between the adjacent shallow wells of the second type 4 defines a first dimension d1 of the shallow wells of the first type 3.

Figure 3:
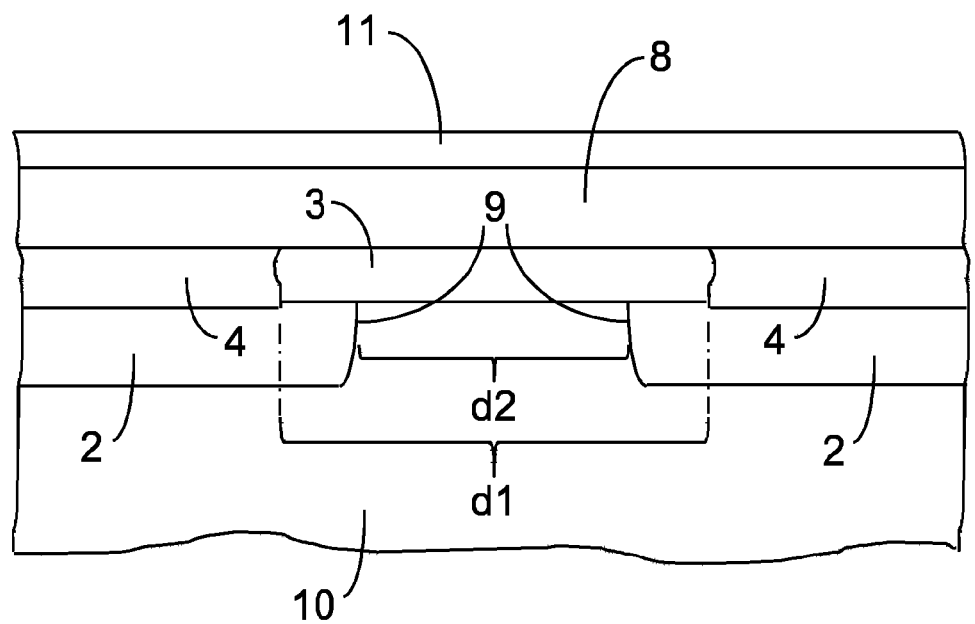
FIG. 3 is a cross section according to FIG. 2 of a further embodiment.

FIG. 3 is a cross section according to FIG. 2 for a further embodiment. Elements shown in FIG. 3 that correspond to elements shown in FIG. 2 are designated with the same reference numerals. In the embodiment according to FIG. 3, each shallow well of the second type 4 is arranged in one deep well of a plurality of separate deep wells of the second type 2. Gaps 9 are present between successive deep wells of the second type 2. The shallow wells of the first type 3 are arranged between adjacent shallow wells of the second type 4 above the gaps 9. The first dimension d1 of the shallow wells of the first type 3, which is defined by the distance between two adjacent shallow wells of the second type 4, is larger than a second dimension d2 of the gaps 9, which is defined by the distance between two adjacent deep wells of the second type 2. In this way each shallow well of the first type 3 laterally exceeds the relevant gap 9 on both sides by at least approximately half the difference between the first dimension d1 and the second dimension d2.

Figure 4:
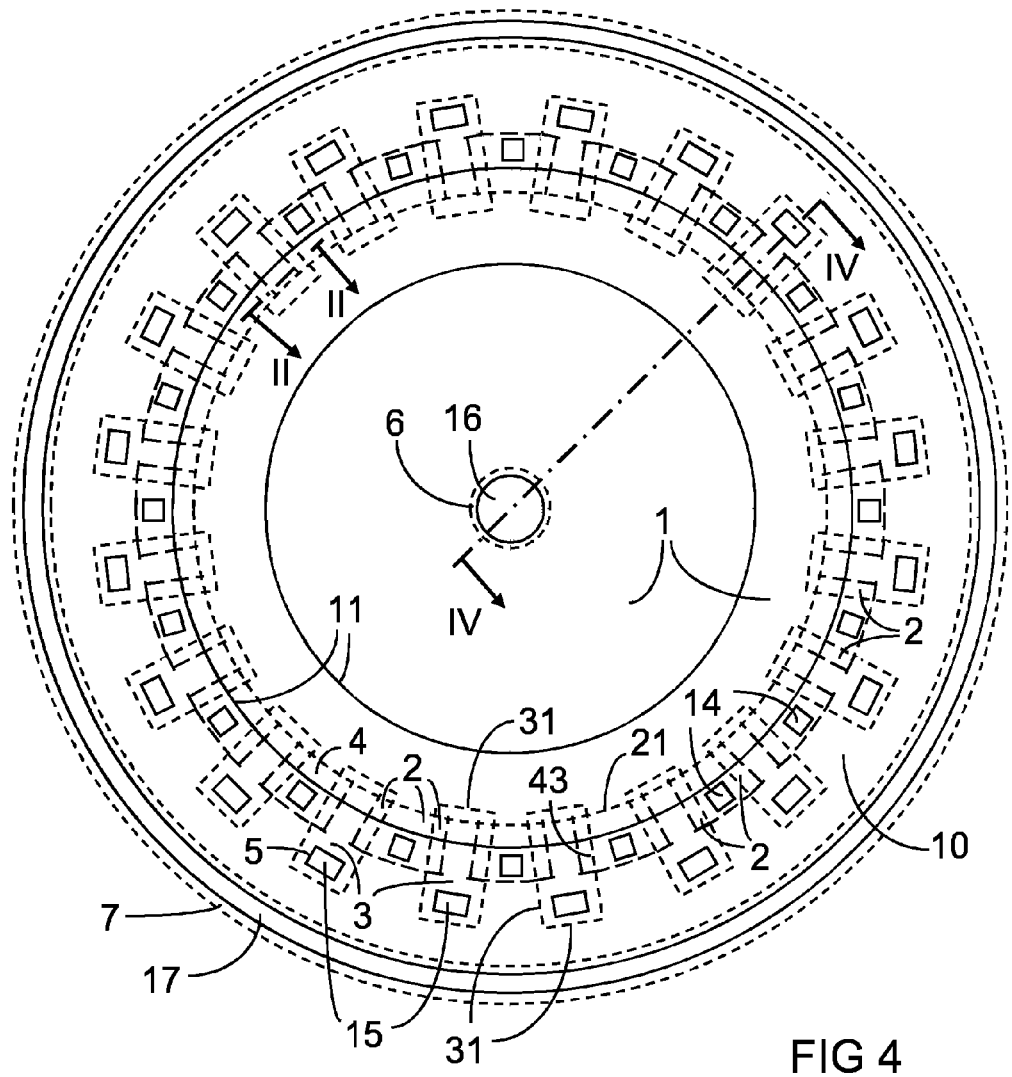
FIG. 4 is a top view of the well structure of the further embodiment according to FIG. 3.

FIG. 4 is a top view according to FIG. 1 for the embodiment according to FIG. 3. Contours of the deep wells of the second type 2 run along two concentric circles limiting an annular area where the deep wells of the second type 2 are arranged at distances from one another. The inner circle approximately coincides with the contour of the outer boundary of the deep well of the first type 1, and the contours of the boundaries 21 between the deep well of the first type 1 and the deep wells of the second type 2 lie on the inner circle. According to FIG. 3, FIG. 4 shows that each shallow well of the second type 4 is arranged in a deep well of the plurality of deep wells of the second type 2, which extend by a small distance under the shallow wells of the first type 3.

Figure 5:
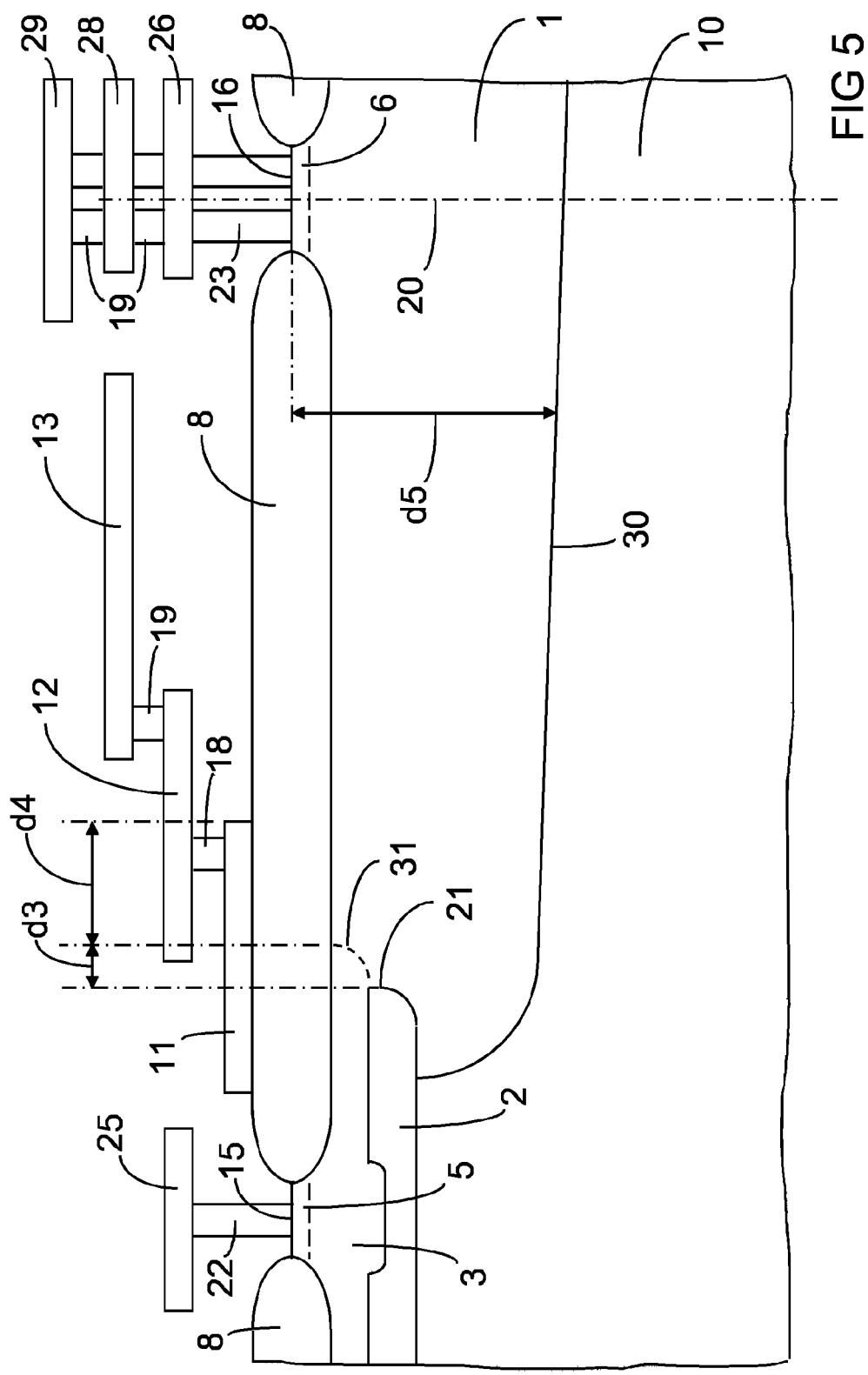
FIG. 5 is a further cross section of the well structure of the embodiment according to FIG. 1.

FIG. 5 is a further cross section of the embodiments according to FIG. 1 in a radial direction at the position indicated in FIG. 1 by a further dash-dotted line with arrows indicating the direction of view. In FIG. 5 elements corresponding to elements shown in FIGS. 1 and 2 are designated with the same reference numerals. FIG. 5 shows the arrangement of the deep well of the first type 1, the deep well of the second type 2 and the shallow wells of the first type 3 in the radial direction. The distance between the center 20, which is indicated in FIG. 5 by a vertical symmetry axis, and the boundary 21 between the deep well of the first type 1 and the deep well of the second type 2 and the distance between the center 20 and the boundary 31 between the deep well of the first type 1 and one of the shallow wells of the first type 3 differ by a first distance d3. The shallow wells of the first type 3 accordingly extend into the deep well of the first type 1.

FIG. 5 also shows the positions of the source regions 5 with their source contact areas 15 and of the drain region 6 with its drain contact area 16. The source regions 5 are electrically connected with a source metal 25 by means of an electrically conductive source contact 22 arranged on the source contact area 15. The drain region 6 is electrically connected with a drain metal 26 by means of at least one electrically conductive drain contact 23 arranged on the drain contact area 16. The source metal 25 and the drain metal 26 may belong to the same metallization layer, especially a first metallization layer. The drain metal 26 can be a lowest metal layer of a drain metal stack comprising further metal layers, which may comprise a second drain metal 28 and a third drain metal 29, for example, as shown in FIG. 5. The drain metals 26, 28, 29 are interconnected by vias 19 as indicated in FIG. 5. The uppermost drain metal may thus be arranged sufficiently high above the substrate 10 to be suitable for a lateral electrical connection. The insulating region 8 may cover the substrate surface between the source regions 5 and the drain region 6.

The first field plate 11 is arranged on the insulating region 8 and partially overlaps the deep well of the first type 1 as well as the deep well of the second type 2. In the direction towards the center 20, the area in which the first field plate 11 overlaps the deep well of the first type 1 exceeds the area in which the first field plate 11 overlaps the shallow wells of the first type 3 by a positive second distance d4, which is also the distance between the portion of the first field plate 11 that overlaps the shallow wells of the first type 3 and an opposite edge of the first field plate 11.

A second field plate 12 and a third field plate 13 are arranged as further field plates at increasing distances from the insulating region 8 above the deep well of the first type 1 in order to extend the first field plate 11 in the direction towards the center 20. The second and third field plates 12, 13 are optional. Further embodiments may comprise only one further field plate or more than two further field plates, which may be arranged at different levels above the substrate 10. The further field plates are electrically conductive and may comprise a metal, for instance. The field plates are electrically connected. In the embodiment shown in FIG. 5, the first field plate 11 and the second field plate 12 are connected by a contact 18 of electrically conductive material like metal, for instance, and the second field plate 12 and the third field plate 13 are connected by a via 19 of electrically conductive material like metal, for instance. The vias 19 may be formed by metal plugs that are arranged between metallization levels, for instance.

FIG. 5 shows that the distances d5 of the lower boundary 30 of the deep well of the first type 1 from the plane of the substrate surface increase towards the center 20. The concentration of the dopants in the deep well of the first type 1 may also increase towards the center 20. Such a lateral doping profile can be produced by an implantation of dopants using a mask with openings that are limited by concentric circles, so that the openings are arranged above concentric annular areas of the substrate surface. If the annular areas of smaller radius have a larger width than the annular areas with larger radius, a plurality of concentric annular implantation regions whose widths increase towards the center 20 are formed, and the concentration of the implanted dopants is accordingly increased towards the center 20. The subsequent diffusion of the dopants yields a sufficiently smooth lateral doping profile with the depth of the deep well of the first type 1 increasing towards the center 20, as indicated in FIG. 5 by the slight inclination of the lower boundary 30. This will be further explained in conjunction with FIG. 7.

Figure 6:
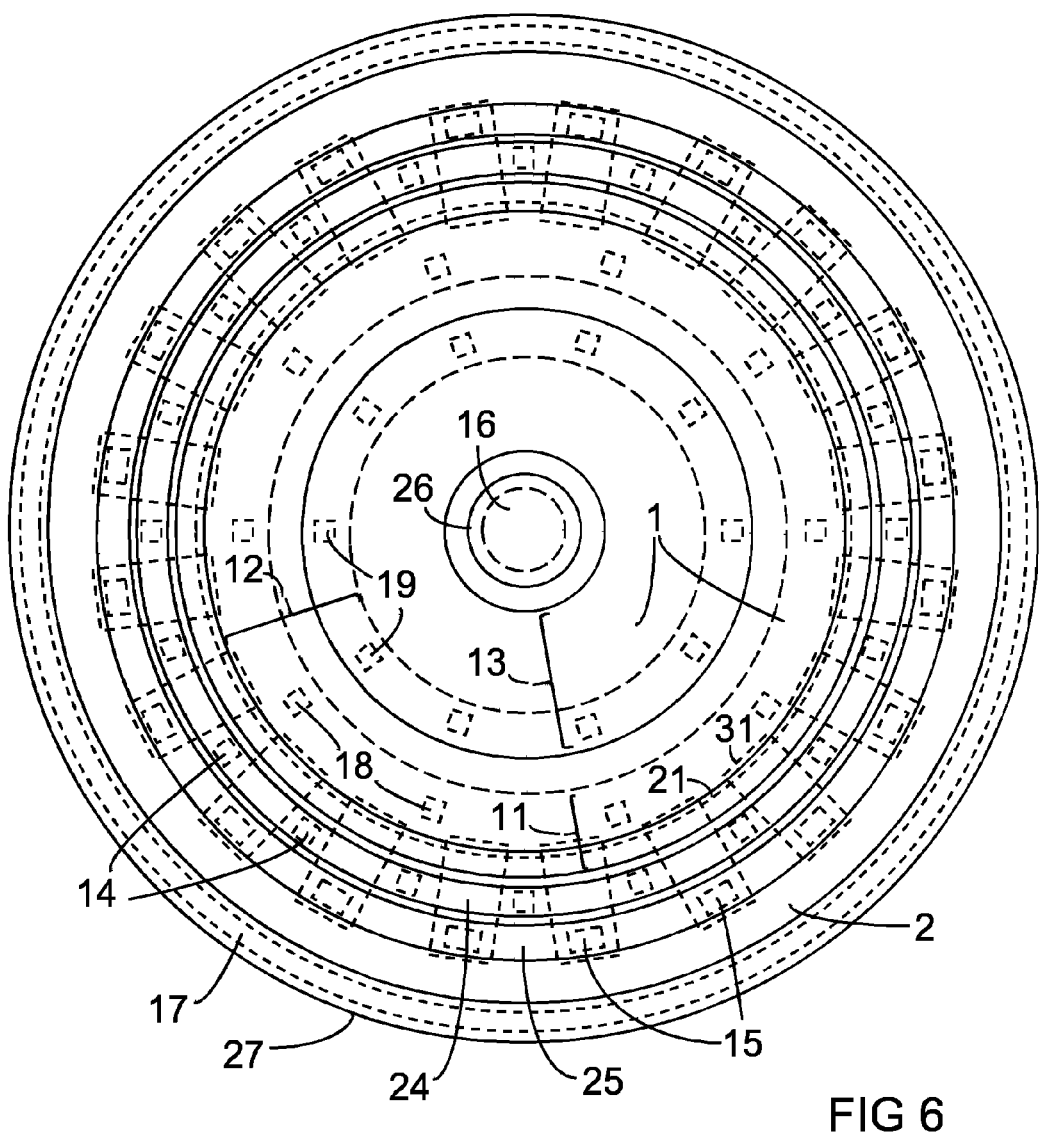
FIG. 6 is a further top view of the embodiment according to FIG. 1 showing further details.

FIG. 6 is a further top view according to FIG. 1 and shows further elements of the semiconductor drift device. In FIG. 6 elements corresponding to elements shown in FIG. 1 are designated with the same reference numerals. FIG. 6 shows the arrangement of the first field plate 11, the second field plate 12 and the third field plate 13 with hidden contours represented by broken lines. The gate contact areas 14 are electrically connected with a common gate metal 24, which may be part of a structured metallization layer, for instance. The source metal 25 is a conductive ring electrically connected to the source contact areas 15 and may belong to the same structured metallization layer, for example, or to a further structured metallization layer. The drain metal 26 connected to the drain contact area 16 may be circular as shown in FIG. 6 or comprise any other suitable shape. The drain metal 26 can be part of any provided structured metallization layer and may especially be the lowest metal layer of a drain metal stack. The substrate contact areas 17 may be electrically connected with a common substrate metal 27, which can also be part of any provided structured metallization layer. The number and distribution of the contacts 18 and vias 19 between the field plates 11, 12, 13 may differ from the example shown in FIG. 6. The gate metal 24, the source metal 25 and the drain metal 26 can be arranged symmetrically with respect to the center if an overall central symmetry of the semiconductor drift device is desired.

Figure 7:
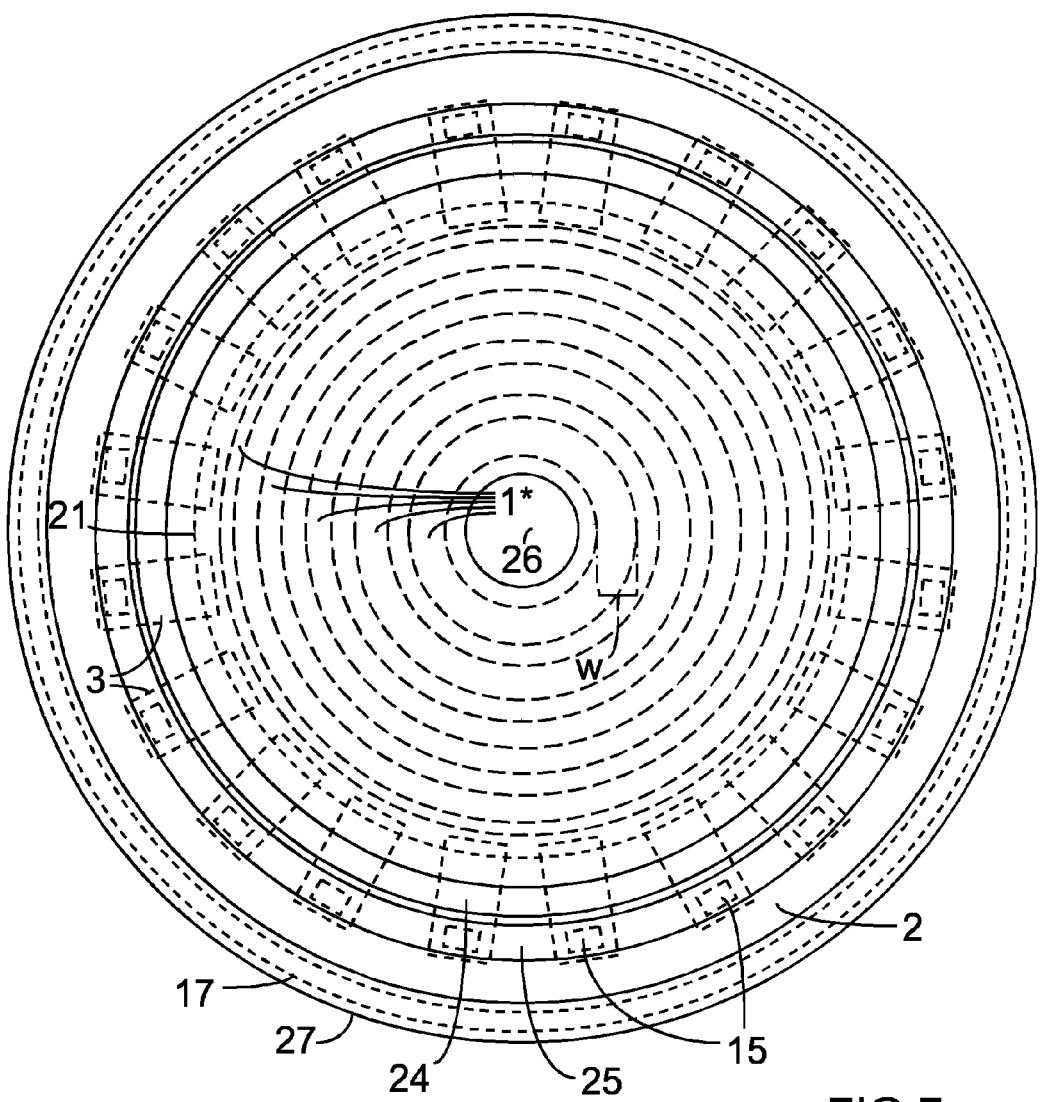
FIG. 7 is a further top view of the embodiment according to FIG. 1 showing implantation regions.

FIG. 7 is a top view according to FIGS. 1 and 6 and shows a plurality of concentric annular implantation regions 1* of the deep well of the first type 1, the annular implantation regions 1 being spaced apart. The annular implantation regions 1* can be produced using a mask comprising openings that are limited by concentric circles. As indicated in FIG. 7, by way of an example not drawn to scale, the widths w of the annular implantation regions 1* may increase towards the center, so that the doping concentration increases towards the center and the lower boundary 30 of the deep well of the first type 1 is slightly inclined according to FIG. 5. An implantation into concentric annular regions that are separated from one another by small distances facilitates the adaptation of the implantation dose to the voltage requirements of the device.

The described semiconductor drift device allows to deliver a current at a high voltage level to a circuit component in the deep well of the first type 1, which is protected against exceedingly high voltage spikes. The device withstands blocking voltages and breakdown voltages of more than 300 V. The deep well of the second type 2 and the shallow wells of opposite types of electrical conductivity 3, 4 facilitate the adjustment of the on-resistance and the pinch-off voltage. The shallow wells of the first type 3 can be precisely arranged close to the substrate surface and efficiently depleted, in the vicinity of the edge of the drift region, by the combination of the wells of the second type 2, 4, in order to achieve a small value of the pinch-off voltage.

In particular, if the first type of electrical conductivity is n-type conductivity and the second type of electrical conductivity is p-type conductivity, the shallow wells of the first type 3 are enclosed by device components at the lowest electrical potential, which are the wells of the second type 2, 4 and the first field plate 11. Due to its higher potential the shallow well of the first type 3 is depleted from all sides and able to conduct current only in the case that the depletion is not complete. Therefore the pinch-off voltage depends on the first dimension d1 shown in FIGS. 2 and 3. In case that a higher pinch-off voltage is desired, gaps 9 can be provided between the deep wells of the second type 2 in areas below the shallow wells of the first type 3. In this case the second dimension d2 shown in FIG. 3 is also relevant to the value of the pinch-off voltage.

The shallow well of the first type 3 extends from the deep well of the second type 2 into the deep well of the first type 1 to establish a connection to the drift region. This is accomplished by adapting the first distance d3 shown in FIG. 5. The extension of the first field plate 11 forming the second distance d4 shown in FIG. 5 ensures an efficient depletion of the shallow well of the first type 3 and an increased breakdown voltage. The gate contact areas 14 are present in the shallow wells of the second type 4, and the contacts on the gate contact areas 14 may be close to the edge of the first field plate 11.

The invention claimed is:

1. A semiconductor drift device, comprising:
 a substrate of semiconductor material;
 a deep well of a first type of electrical conductivity provided for a drift region in the substrate;
 a drain region of the first type of electrical conductivity arranged at a surface of the substrate at a center of the deep well of the first type;
 a plurality of source regions of the first type of electrical conductivity arranged outside the deep well of the first type;
 a deep well or a plurality of deep wells of a second type of electrical conductivity opposite to the first type of electrical conductivity provided for a plurality of gate regions at the periphery of the deep well of the first type;
 the source regions being arranged in shallow wells of the first type of electrical conductivity at the periphery of the deep well of the first type; and
 the gate regions being formed by shallow wells of the second type of electrical conductivity, which are arranged in the deep well of the second type between the shallow wells of the first type.

2. The semiconductor drift device of claim 1, wherein one continuous deep well of the second type is provided for the gate regions, and the shallow wells of the second type are arranged in the continuous deep well of the second type.

3. The semiconductor drift device of claim 1, wherein a plurality of separate deep wells of the second type is provided for the gate regions, and each shallow well of the second type is arranged in one of the deep wells of the plurality of deep wells of the second type.

4. The semiconductor drift device of claim 1, further comprising:
 a gate metal electrically connected to gate contact areas of the shallow wells of the second type;
 a source metal electrically connected to source contact areas of the source regions; and
 a drain metal electrically connected to a drain contact area of the drain region.

5. The semiconductor drift device of claim 1, wherein the shallow wells of the first type are arranged at the same distance from the center, and the shallow wells of the second type are arranged at the same distance from the center.

6. The semiconductor drift device of claim 1, wherein the shallow wells of the first type extend into the deep well of the first type and thus exceed a boundary between the deep well of the first type and the deep well of the second type by a positive first distance.

7. The semiconductor drift device of claim 1, further comprising:
 an insulating region covering the substrate between the source regions and the drain region; and
 a first field plate arranged on the insulating region, the first field plate partially overlapping the shallow wells of the first type and the shallow wells of the second type.

8. The semiconductor drift device of claim 7, wherein the first field plate partially overlaps the deep well of the first type, so that a second distance between a portion of the first field plate that overlaps the shallow wells of the first type and an opposite edge of the first field plate is positive.

9. The semiconductor drift device of claim 7 or 8, wherein at least one further field plate is arranged at a distance from the insulating region above the deep well of the first type and is electrically connected with the first field plate.

10. The semiconductor drift device of claim 9, wherein the first field plate is polysilicon and the further field plate is metal.

11. The semiconductor drift device of claim 1, further comprising:
 a lower boundary of the deep well of the first type having distances from a plane of the substrate surface that increase towards the center.

12. The semiconductor drift device of claim 1, wherein the deep well of the first type has a doping concentration that increases towards the center.

* * * * *